United States Patent [19]
Cherry

[11] Patent Number: 4,466,046
[45] Date of Patent: Aug. 14, 1984

[54] CAPACITIVE KEYBOARD SWITCH

[75] Inventor: Walter L. Cherry, Winnetka, Ill.

[73] Assignee: Cherry Electrical Products Corporation, Waukegan, Ill.

[21] Appl. No.: 482,567

[22] Filed: Apr. 6, 1983

Related U.S. Application Data

[63] Continuation-in-part of Ser. No. 379,059, May 17, 1982, , which is a continuation-in-part of Ser. No. 318,483, Nov. 5, 1981, abandoned.

[51] Int. Cl.$^3$ .............................................. H01G 5/01
[52] U.S. Cl. ................................................. 361/288
[58] Field of Search ............................... 361/287, 288; 84/DIG. 7; 200/DIG. 1

[56] References Cited
U.S. PATENT DOCUMENTS

| | | | |
|---|---|---|---|
| 3,653,038 | 3/1972 | Webb | 340/365 |
| 3,659,163 | 4/1972 | Borisov et al. | 200/181 X |
| 3,797,630 | 3/1974 | Zilkha | 340/365 X |
| 4,083,100 | 4/1978 | Flint et al. | 29/622 |
| 4,209,819 | 6/1980 | Seignemartin | 361/288 |

FOREIGN PATENT DOCUMENTS

| | | | |
|---|---|---|---|
| 57-55014 | 4/1982 | Japan . | |
| 654950 | 3/1979 | U.S.S.R. | 361/288 |

OTHER PUBLICATIONS

I.B.M. Technical Disclosure Bulletin, Jan. 1982, vol. 24, No. 8, pp. 4014-4015.

*Primary Examiner*—Donald A. Griffin
*Attorney, Agent, or Firm*—Willian Brinks Olds Hofer Gilson & Lione Ltd.

[57] ABSTRACT

A capacitive switch employs a conical conducting spring disposed within a switch housing in spaced relation to an underlying capacitive plate which is covered by a dielectric layer. The bottom coil of the spring engages slots of the housing so that the spring is held above the capacitive plate. A substantially zero capacitance is defined when the switch is in its rest state with the spring biasing a switch pushbutton upwardly. When the pushbutton is pressed, the spring is compressed against the underlying capacitive plate. The compressed coils of the spring define a predefined capacitance which indicates the depressed condition of the switch.

19 Claims, 5 Drawing Figures

CAPACITIVE KEYBOARD SWITCH

CROSS REFERENCE TO RELATED APPLICATIONS

This application is a continuation-in-part of prior copending application Ser. No. 379,059, filed May 17, 1982. Application Ser. No. 379,059 is a continuation-in-part of application Ser. No. 318,483, filed Nov. 5, 1981, now abandoned.

TECHNICAL FIELD

The invention relates to a capacitive keyboard switch which defines substantially zero capacitance in its rest state and a predefined detectable capacitance when it is depressed. More particularly, the invention is directed to a capacitive keyboard switch which employs a conical spring to define its switching capacitance.

BACKGROUND OF THE INVENTION

Capacitive keyboards typically have many switch keys which may be pressed and released to respectively define active and inactive switch states. Each switch key has a capacitive element that defines a low capacitance when the key is inactive and a relatively higher capacitance when the key is pressed. The change in capacitance of a key therefore indicates the operational state of the key.

Capacitive keyboards are desirable because of their structural simplicity and their associated relatively low manufacturing cost. Also, capacitive keyboards have a potentially higher reliability and a longer life than keyboards with keys that physically make and break conductive connections.

It has been suggested that a capacitive keyboard switch may utilize a spring to define a capacitance which indicates the operational state of the switch. In operation, when a pushbutton of the switch is at rest, the spring is fully extended to define a minimum capacitance with respect to an underlying dielectric sheet and stationary capacitor plate. When the pushbutton is pressed, the spring is compressed so that its coils spread out over the dielectric sheet and the underlying capacitor plate. The compressed coils of the spring are disposed adjacent to the underlying plate and therefore define an increased capacitance for as long as the pushbutton is pressed. The change in capacitance from the rest state to the depressed state is detected by a capacitance monitoring circuit which then operates assoicated switch-controlled apparatus.

A capacitive switch monitoring system can have increased reliability and greater simplicity if the switch defines a substantially zero capacitance in its rest state. The improvement in operation is due to the fact that it is easier and moe reliable to detect a change from a substantially zero capacitance to a greater capacitance, than to detect a change between two substantially non-zero values of capacitance.

Accordingly, it is an object of the invention to provide a relatively simple and reliable capacitive keyboard switch which defines a substantially zero capacitance when the switch is in its rest position and an increased capacitance when the switch is pressed.

A further object of the invention is to provide a capacitive keyboard switch with a conical conducting spring and with means for supporting the spring in spaced relation over an underlying capacitive plate, so that the spring defines a substantially zero capacitance when its associated switch pushbutton is in a rest position.

Another object of the invention is to provide a capacitive keyboard switch that is relatively easy to assemble. The switch has a capacitive spring which is trapped in slots of a switch housing and which is supported above an insulated capacitive plate of a printed circuit board. The spring has a tail portion which can be easily located for soldering to the circuit board.

A further object of the invention is to provide a quiet capacitive keyboard switch wherein the capacitive spring of the switch is supported above a printed circuit board to prevent the board from amplifying the sound of movement of the spring.

BRIEF SUMMARY OF THE INVENTION

In order to achieve the objects of the invention and to overcome the problems of the prior art, the improved capacitive keyboard switch of the invention includes a housing that supports a conical conducting spring over an underlying capacitive plate with a dielectric coating. The bottom coil of the conical spring engages slots in the housing, so that the spring is retained in the housing and is held in spaced relation over the underlying capacitive plate.

A pushbutton is slidingly engaged with the housing and is biased upwardly by the conical spring. The spring defines a substantially zero capacitance with respect to its underlying capacitive plate when the pushbutton is in its rest position. When the pushbutton is pressed, the spring is compressed so that a predetermined detectable capacitance is defined between the plate and the spring. The capacitance returns to substantially zero when the pushbutton is released.

DETAILED DESCRIPTION OF PREFERRED EMBODIMENT

Figure 1:
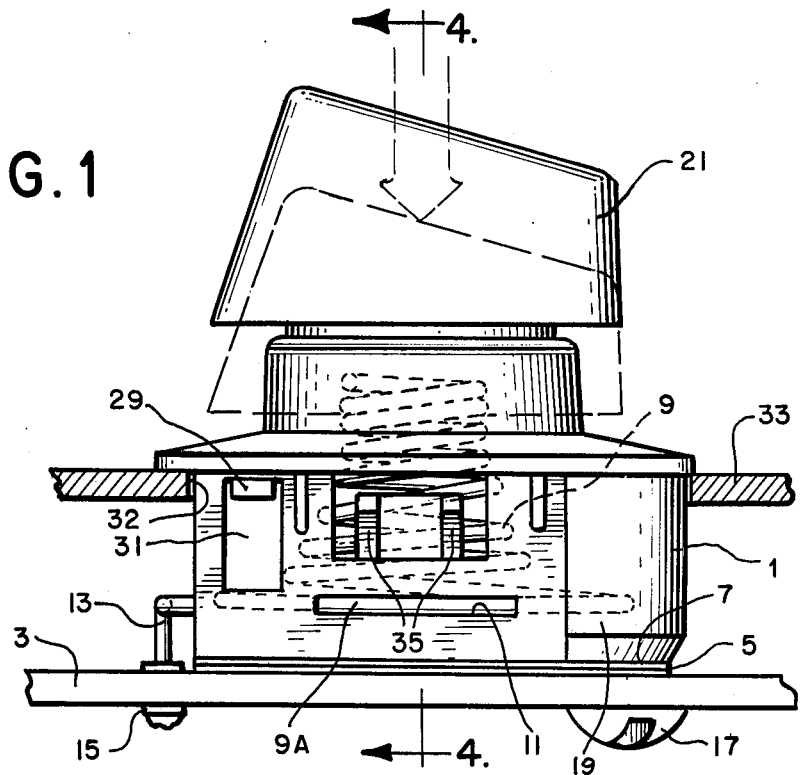
FIG. 1 illustrates a side elevation view of a capacitive keyboard switch, in accordance with the invention.

The remaining portion of the specification will describe a preferred embodiment of the invention when read in conjunction with the attached drawings, in which like reference characters identify identical apparatus.

FIG. 1 illustrates a side elevation view of a capacitive switch, in accordance with the invention. As shown in FIG. 1, a housing 1 of the switch is supported on a printed circuit board 3 which has a conducting capacitive plate 5 and an overlying dielectric film 7. A conducting conical spring 9, shown in hidden lines, is supported within the housing. The bottom coil 9A of the spring is engaged in slots 11 that are disposed at opposite sides of the housing. The base of the spring is therefore held in space relation over the insulated capacitive plate 5.

An end 13 of the coil spring 9 is bent downwardly and engaged in an underlying eyelet 15 formed in the printed circuit board 3 in a manner known to the art. The eyelet is conductively connected to a remote terminal (not shown) which is connected to a capacitance monitoring circuit (not shown). The end 13 of the spring is soldered in its eyelet to provide a conducting path between the capacitance monitoring circuit and the spring. The eyelet 15 is spaced in insulated relation from the capacitive plate 5 and therefore does not affect the capacitive relationship between the coil and the plate.

The end 13 of the spring 9 is easily aligned and soldered in its underlying eyelet in the process of manufacturing, because the spring is trapped within the housing 1 with the end 13 held at a fixed location.

The housing 1 is held in place on the printed circuit board 3 by a screw 17 which extends through the printed circuit board and engages a post 19 of the housing 1. A pushbutton 21 is biased upwardly by the conical spring 9 so that the spring is fully extended when the pushbutton is in its rest position. When the pushbutton 21 is pressed, the underlying conical spring 9 is compressed so that its coils collapse into one another and approach the capacitive plate to define a switch capacitance between the coil and the plate.

Figure 2:
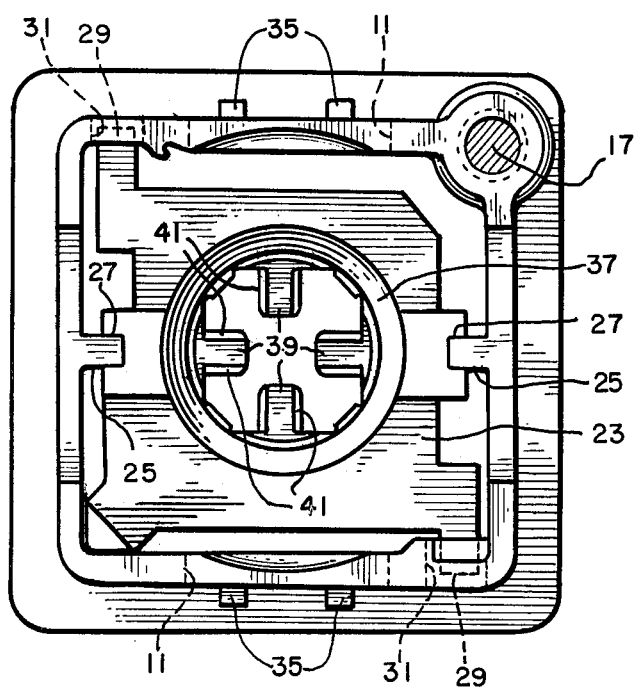
FIG. 2 illustrates a bottom elevation view of the capacitive keyboard switch of FIG. 1, with the conical spring removed.

FIG. 2 illustrates a bottom elevation view of the switch of FIG. 1, with the conical spring 9 removed. As shown in FIG. 2, guide rails 25 formed in the housing engage associated slots 27 of a plunger plate 23. The plunger plate 23 reciprocates within the housing along the rails 25. As shown in FIG. 1, the plunger plate 23 is further guided in the housing by extending intregal tabs 29 which slide in guide slots 31 of the housing. In operation, the slots 31 define the extent of upward and downward movement of the plunger plate 23.

Figure 3:
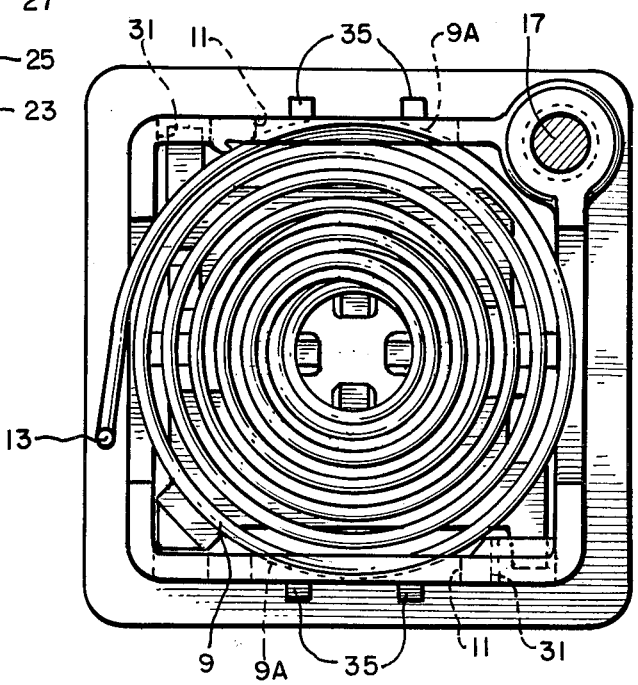
FIG. 3 illustrates a bottom elevational view of the capacitive keyboard switch of FIG. 1, with the conical spring engaged.

FIG. 3 illustrates a bottom view of the switch of FIG. 1, with the conical spring 9 in position. As indicated with respect to FIG. 1, the conical spring is engaged in slots 11 of the housing and is therefore held within the housing in spaced relation above the plate 5.

Figure 4:
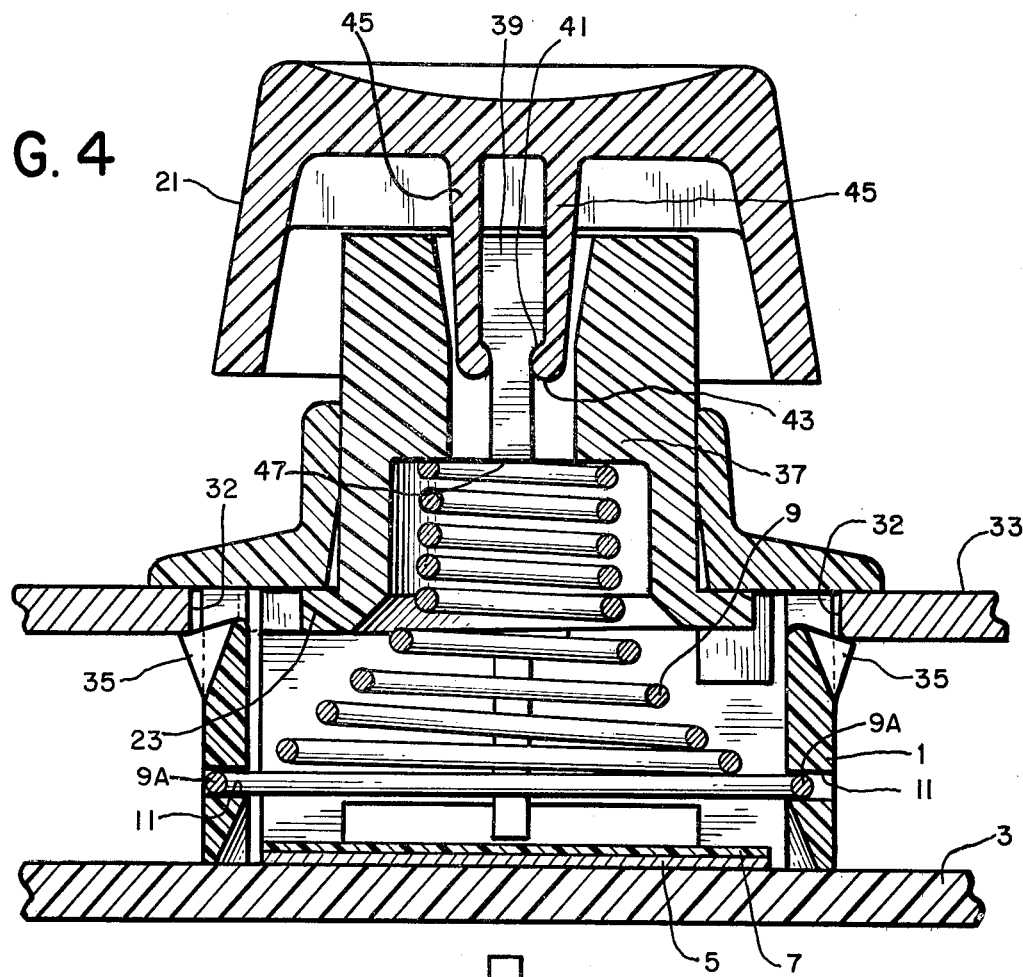
FIG. 4 illustrates a cross-sectional view of the switch of FIG. 1 taken along a line 4—4, with the pushbutton at its rest position.

FIG. 4 illustrates a cross-sectional view of the switch of FIG. 1, taken along a line 4—4. As shown in FIG. 4, the conical spring 9 is fully extended to bias the pushbutton 21 in an upward, rest position. The housing 1 of the capacitive switch is held in position within a keyboard cover 33 by resilient wedges 35 that extend outwardly from the housing 1. In operation, the housing 1 is pressed into an opening 32 in the keyboard cover 33 and, as the housing passes through the opening, the resilient wedges 35 are pressed inwardly to allow the housing to pass into the area between the circuit board 3 and the cover 33. When the housing is disposed in position over the printed circuit board 3, the wedges 35 spring outwardly and therefore wedge the housing in the opening of the keyboard cover 33.

The pushbutton 21 is detachably engaged with a cylindrical plunger portion 37 of the plunger plate 23. As shown in FIGS. 2 and 4, the cylindrical plunger 37 has longitudinally extending ribs 39 with step portions 41 that engage raised ridges 43 of inwardly biased spring tabs 45 of the pushbutton 21. The ridges 43 and associated steps 41 engage one another to provide a snap connection between the pushbutton 21 and plunger 37. Thus, the pushbutton 21 and plunger 37 reciprocate in the housing as a unit. The top portion of the helical spring 9 is cylindrically shaped and abuts the bottom portions 47 of the longitudinal ribs 39 so that the pushbutton is biased upwardly to its rest position. The bottom portion of the spring 9 is conically shaped and the coils of the bottom portion are suspended above the underlying insulated plate 5 to define a substantially zero rest capacitance.

Figure 5:
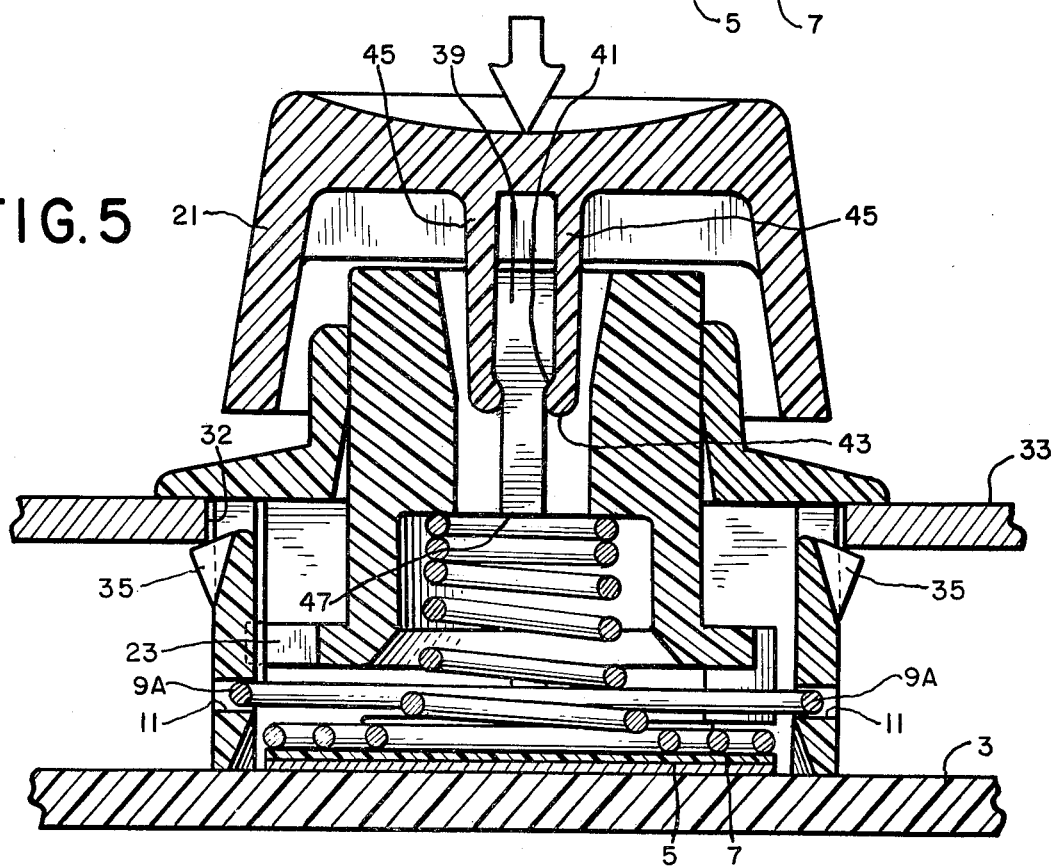
FIG. 5 illustrates a cross-sectional view of the switch of FIG. 1 taken along a line 4—4, with the pushbutton shown in its depressed position.

FIG. 5 illustrates the cross-sectional view of FIG. 4, with the pushbutton 21 pressed downwardly and the conical spring compressed to provide a predefined capacitance. As shown in FIG. 5, coils of the bottom conical portion of the spring 9 are pressed against the insulated surface 7 of the underlying capacitive plate 5 to provide a switch activation capacitance which a detection circuit (not shown) can readily distinguish from the substantially zero rest capacitance.

After the coils of the conical portion of the spring 9 are compressed against the insulated surface 7, the coils of the top cylindrical portion of the spring are compressed to provide a desirable "overtravel" feel to the switch. It should now be understood that, when the pushbutton 21 is released, the conical and cylindrical portion of the spring 9 expand upwardly until the entire spring is held in spaced relation over the capacitive plate, as shown in FIG. 4. The spaced positioning of the spring of FIG. 4 defines a substantially zero capacitance which can easily be detected as a rest state for the switch.

The capacitive spring 9 is supported so that its coils do not touch the underlying insulated capacitive plate when the pushbutton 21 is positioned in its rest state. The spring is suspended in the indicated fashion to facilitate assembly of the switch. Also, when the spring is suspended, and the pushbutton is pressed, the sound of movement of the coils of the conical spring will not be transmitted and amplified by the underlying printed circuit board. The capacitive switch of FIGS. 4 and 5 is therefore easy to assemble and operates more quietly than would a switch with coils that contact the printed circuit board during initial movement of the pushbutton.

It should be understood that the invention is not limited to the use of capacitive elements such as springs or to capacitive elements which touch an insulated capacitive plate as shown in FIG. 5. Thus, for example, a foam pad with an electrically conducting film may be employed as a movable capacitive element without departing from the invention. An additional spring could also be provided to bias the pushbutton 21 upwardly.

Moreover, the foam pad, spring or other movable capacitive element could be supported in spaced relation above an underlying capacitive plate during the rest state of the switch and could be moved adjacent to but spaced from the plate to define a switch activation capacitance when the switch is pressed.

Accordingly, the invention may be embodied in many different specific forms without departing from its spirit or essential characteristics. The present embodiments are therefore to be considered in all respects as illustrative and not restrictive. The scope of the invention is indicated by the claims rather than by the foregoing description and, accordingly, all changes which come within the meaning and range of the equivalents of the claims are intended to be embraced therein.

I claim:
1. A capacitive switch, comprising:
an electrically conducting plate;
a dielectric film covering said plate;

capacitance means for resiliently moving between an expanded rest position and a compressed activation position with respect to said plate;

pushbutton means contacting said capacitance means for compressing the capacitance means to its activation position when the pushbutton means is pressed and for releasing the capacitance means to its expanded rest position when the pushbutton means is released; and means for supporting said capacitance means in spaced relation to said plate, so that the capacitance means and plate define a predetermined capacitance when the capacitance means is in its compressed position and a substantially zero capacitance when the capacitance means is in its rest position.

2. The capacitive switch of claim 1, wherein said means for supporting includes a housing for covering said plate and capacitance means, the housing having at least two slots for supporting a base portion of said capacitance means to hold the capacitance means in spaced relation above said plate.

3. The capacitive switch of claim 2, wherein said pushbutton means includes a plate portion having extending guide tabs and said housing includes,
means for slidingly engaging said pushbutton means, and
guide slots for slidingly receiving the guide tabs to define limits of reciprocating sliding movement of said pushbutton means with respect to said housing.

4. The capacitive switch of claim 2, wherein said pushbutton means includes,
a button portion with integral longitudinally extending spring tabs having transverse ridges, and
a cylinder portion for slidingly engaging said housing and having raised step areas for engaging and pressing against said ridges in a lock fit, so that the button portion and cylinder portion reciprocate in said housing as a unit.

5. The capacitive switch of claim 1, wherein said capacitance means is an electrically conducting spring having a plurality of coils and said means for supporting includes a housing with slots for engaging the bottom coil of the spring and holding the spring in spaced relation above the plate.

6. The capacitive switch of claim 1, wherein said capacitance means includes a spring having coils forming a bottom conically shaped portion and coils forming a top cylindrically shaped portion, coils of the conically shaped portion compressing against said dielectric film to define said predetermined capacitance and coils of said cylindrically shaped portion compressing to provide an overtravel feel for the pushbutton means.

7. The capacitive switch of claim 1, wherein said capacitance means includes an electrically conducting spring having a tail end, the capacitive switch further including board means for supporting said plate and dielectric film, said board means including a conducting eyelet; the means for supporting including a housing for trapping said spring in spaced relation to said board means, so that the tail end of the spring can be aligned with and inserted into said eyelet.

8. A capacitive switch, comprising:
an electrically conducting plate;
a dielectric film covering said plate;
support means for supporting said plate and dielectric film;

electrically conducting spring means for resiliently moving between an expanded rest position and a compressed activation position with respect to the plate; and means for supporting said spring means in spaced relation to said plate when the spring means is in said rest position, so that the sound of movement of said spring means is not conducted by the spring means to said support means and so that the spring means and plate define a detectable capacitance greater than zero when the spring means is in its compressed position and a substantially zero capacitance when the spring means is in its rest position.

9. A capacitive switch, comprising:
an electrically conducting plate;
a dielectric film covering the plate;
electrically conducting spring means for resiliently moving between an expanded rest position and a compressed activation position with respect to said plate;
pushbutton means for compressing the spring means to its activation position when the pushbutton means is pressed and for releasing the spring means to its expanded rest position when the pushbutton means is released; and
a housing for covering the plate, dielectric film and spring means and for engaging said pushbutton means for reciprocating sliding movement, the housing including means for supporting a base portion of said spring means in spaced relation above said plate, so that the spring means and plate define a substantially zero capacitance when the spring means is in its rest position and the spring means and plate define a detectable capacitance greater than zero when the spring means is in its compressed position.

10. The capacitive switch of claim 9, wherein said means for supporting includes slots formed in said housing for receiving a portion of said spring means.

11. The capacitive switch of claim 9, wherein said spring means includes a spring having a plurality of coils.

12. The capacitive switch of claim 9, wherein said spring means includes an electrically conducting spring having a plurality of coils and said means for supporting includes slots formed in said housing for receiving at least one of said coils.

13. The capacitive switch of claim 9, wherein said spring means includes an electrically conducting spring having coils forming a bottom conically shaped portion and coils forming a top cylindrically shaped portion, coils of the conically shaped portion compressing to define said detectable capacitance and coils of said cylindrically shaped portion compressing to provide an overtravel feel for the pushbutton means.

14. A capacitive switch, comprising:
a resilient, electrically conductive movable capacitance means having an electrically conducting extending terminal, said movable capacitance means having means for selectively moving between an expanded rest position and a compressed activation position;
stationary capacitance means positioned adjacent to said movable capacitance means for defining a switch capacitance having a magnitude corresponding to the position of said movable capacitance means;

board means for supporting said stationary capacitance means and including an electrically conducting eyelet means for conductively engaging said terminal; and a housing for trapping said movable capacitance means in spaced relation to said stationary capacitance means and for fixing the position of said extending terminal, so that the terminal may be aligned and engaged with said eyelet means.

15. The capacitive switch of claim 14, wherein said movable capacitance means includes an electrically conducting spring and said extending terminal is a downwardly extending end portion of the spring.

16. A capacitive switch, comprising:
a stationary capacitance means;
an electrically conducting spring having coils forming a top cylindrically shaped portion and a bottom conically shaped portion, said conically shaped portion for moving between an expanded rest position above said stationary capacitance means and a compressed activation position against the stationary capacitance means and said cylindrically shaped portion for compressing to provide an overtravel feel for the switch when the conically shaped portion is compressed; and
a housing means for supporting said spring in spaced relation above said stationary capacitance means, so that a predetermined switch activation capacitance is defined when the conically shaped portion of the spring is compressed against said stationary capacitance means and a substantially zero capacitance is defined when the conically shaped portion is at its expanded rest position above said stationary capacitance means.

17. The capacitive switch of claim 16, including a connector means for conductively contacting said spring, said spring having a downwardly extending terminal end and said housing means having slots for engaging and supporting said spring in a trapped position within the housing means, so that the terminal end may be easily disposed in conductive contact with the connector means.

18. A capacitive switch, comprising:
an electrically conducting plate;
a dielectric film covering the plate;
an electrically conducting spring having a plurality of coils for resiliently moving between an expanded rest position and a compressed activation position with respect to said plate;
pushbutton means for compressing the spring to its activation position when the pushbutton means is pressed and for releasing the spring to its expanded rest position when the pushbutton means is released; and
a housing for covering the plate, dielectric film and spring and for engaging said pushbutton means for reciprocating sliding movement, the housing including at least two slots for engaging a base coil of said spring and supporting the spring in spaced relation above said plate, so that the spring and plate define a substantially zero capacitance when the spring is in its rest position and the spring and plate define a detectable capacitance greater than zero when the spring is in its compressed position.

19. The capacitive switch of claim 18, wherein the coils of said spring form a top cylindrically shaped portion and a bottom conically shaped portion, the coils of the conically shaped portion compressing to define said detectable capacitance and the coils of said cylindrical portion compressing to provide an overtravel feel for the pushbutton means.

* * * * *

UNITED STATES PATENT AND TRADEMARK OFFICE
CERTIFICATE OF CORRECTION

PATENT NO. : 4,466,046
DATED : August 14, 1984
INVENTOR(S) : Walter L. Cherry

It is certified that error appears in the above-identified patent and that said Letters Patent is hereby corrected as shown below:

On the cover page, under the section "Related U.S. Application Data", after "1982," delete ",".

In the specification, column 1, line 10, before "now" insert --and--;

column 1, line 49, delete "assoicated" and insert therefor --associated--;

column 1, line 55, delete "moe" and insert therefor --more--;

column 3, line 1, delete "space" and insert therefor --spaced--;

column 3, line 35, delete "intregal" and insert therefor --integral--.

Signed and Sealed this

Fourteenth Day of October, 1986

[SEAL]

Attest:

DONALD J. QUIGG

Attesting Officer  Commissioner of Patents and Trademarks